(12) United States Patent
Yu et al.

(10) Patent No.: US 12,249,984 B2
(45) Date of Patent: Mar. 11, 2025

(54) INTEGRATED CIRCUIT INCLUDING POWER GATING CIRCUIT

(71) Applicant: SAMSUNG ELECTRONICS CO., LTD., Suwon-si (KR)

(72) Inventors: Changyeon Yu, Hwaseong-si (KR); Pansuk Kwak, Goyang-si (KR); Daeseok Byeon, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 217 days.

(21) Appl. No.: 17/886,194

(22) Filed: Aug. 11, 2022

(65) Prior Publication Data

US 2023/0073878 A1 Mar. 9, 2023

(30) Foreign Application Priority Data

Sep. 3, 2021 (KR) .................. 10-2021-0117938

(51) Int. Cl.
| | | |
|---|---|---|
| *H01L 27/02* | (2006.01) | |
| *G06F 1/26* | (2006.01) | |
| *H03K 17/687* | (2006.01) | |
| *H03K 19/00* | (2006.01) | |
| *H03K 19/003* | (2006.01) | |

(52) U.S. Cl.
CPC ........... *H03K 19/0016* (2013.01); *G06F 1/26* (2013.01); *H03K 17/687* (2013.01); *H03K 19/0013* (2013.01); *H03K 19/00384* (2013.01)

(58) Field of Classification Search
CPC ........ G06F 1/26; H03K 3/027; H03K 17/687; H03K 19/0013; H03K 19/0016; H03K 19/00384
See application file for complete search history.

(56) References Cited

U.S. PATENT DOCUMENTS

| | | | |
|---|---|---|---|
| 6,861,878 B2 * | 3/2005 | Haruhana | H03K 5/249 327/88 |
| 7,372,765 B2 | 5/2008 | Hardee | |
| 7,659,773 B2 | 2/2010 | Choi et al. | |
| 7,723,867 B2 * | 5/2010 | Willingham | H03K 19/0016 307/80 |
| 7,840,926 B2 | 11/2010 | Kim et al. | |
| 7,911,855 B2 * | 3/2011 | Tada | H03K 19/0016 365/63 |
| 8,659,316 B2 | 2/2014 | Kim et al. | |
| 8,742,827 B2 | 6/2014 | Van Winkelhoff et al. | |
| 9,142,629 B2 * | 9/2015 | Nishizaki | G06F 1/3287 |
| 9,627,037 B2 * | 4/2017 | Kim | G11C 8/10 |
| 10,605,864 B2 * | 3/2020 | Kim | G01R 31/3177 |

(Continued)

*Primary Examiner* — Kurtis R Bahr
(74) *Attorney, Agent, or Firm* — Sughrue Mion, PLLC

(57) ABSTRACT

An integrated circuit includes a logic circuit comprising a plurality of logic transistors, the logic circuit comprising a plurality of logic gate lines extending in a first direction; and a power gating circuit comprising a plurality of power gating transistors, the power gating circuit comprising a first power gate line extending in a second direction that is perpendicular to the first direction, and the power gating circuit being connected to the logic circuit, wherein a plurality of source regions respectively included in the plurality of power gating transistors are connected to each other, or a plurality of drain regions respectively included in the plurality of power gating transistors are connected to each other.

19 Claims, 16 Drawing Sheets

(56) References Cited

U.S. PATENT DOCUMENTS

| | | |
|---|---|---|
| 10,892,754 B2 | 1/2021 | Kim |
| 2006/0220722 A1* | 10/2006 | Komura .................... G06F 1/10 |
| | | 327/291 |
| 2008/0066035 A1 | 3/2008 | Asao |
| 2016/0006433 A1* | 1/2016 | Ishizu .................. H03K 17/687 |
| | | 327/427 |

* cited by examiner

INTEGRATED CIRCUIT INCLUDING POWER GATING CIRCUIT

CROSS-REFERENCE TO RELATED APPLICATION

This application is based on and claims priority under 35 U.S.C. § 119 to Korean Patent Application No. 10-2021-0117938, filed on Sep. 3, 2021, in the Korean Intellectual Property Office, the disclosure of which is incorporated by reference herein in its entirety.

BACKGROUND

The present disclosure relates to an integrated circuit, and more particularly, to an integrated circuit including a power gating circuit.

To meet the need for miniaturized, multifunctional, and high-performance electronic products, a high-capacity integrated circuit is required and increased integration density is required to provide a high-capacity integrated circuit. By using field-effect transistors having a small size, the area of the integrated circuit may be reduced, but the amount of a leakage current may increase as the gate length of the transistors decreases.

SUMMARY

One or more example embodiments provide an integrated circuit including a power gating circuit that has a small area and reduces the amount of a leakage current.

Aspects of the present disclosure are not limited to the foregoing, and other unmentioned aspects will be apparent to those of skill in the art from the following description.

According to an aspect of an example embodiment, an integrated circuit includes: a logic circuit including a plurality of logic transistors, the logic circuit including a plurality of logic gate lines extending in a first direction; and a power gating circuit including a plurality of power gating transistors, the power gating circuit including a first power gate line extending in a second direction that is perpendicular to the first direction, and the power gating circuit being connected to the logic circuit, wherein a plurality of source regions respectively included in the plurality of power gating transistors are connected to each other, or a plurality of drain regions respectively included in the plurality of power gating transistors are connected to each other.

According to an aspect of an example embodiment, an integrated circuit includes: a plurality of logic transistors including a first logic transistor connected between a power supply node and a first node, wherein the power supply node is configured to have a power supply voltage applied thereto; a second logic transistor connected between the power supply node and a second node; a third logic transistor connected between the power supply node and a third node; a fourth logic transistor connected between the first node and a first virtual ground node; a fifth logic transistor connected between the second node and a second virtual ground node; and a sixth logic transistor connected between the third node and a third virtual ground node; and a plurality of power gating transistors including a first power gating transistor connected between the first virtual ground node and a ground node wherein a ground voltage is applied to the ground node; a second power gating transistor connected between the second virtual ground node and the ground node; and a third power gating transistor connected between the third virtual ground node and the ground node; and a logic gate line extending in a first direction, wherein at least one of the plurality of power gating transistors is connected to a first power gate line extending in a second direction that is perpendicular to the first direction.

According to an aspect of an example embodiment, an integrated circuit includes: a logic circuit; and a power gating circuit configured to be turned on and become short-circuited when the logic circuit is in an operation state, and to be turned off when the logic circuit is in a standby state to block a current, wherein the logic circuit includes a plurality of logic gate lines extending in a first direction, and the power gating circuit includes at least one power gate line extending in a second direction that is perpendicular to the first direction.

BRIEF DESCRIPTION OF THE DRAWINGS

Example embodiments will be more clearly understood from the following detailed description taken in conjunction with the accompanying drawings in which.

DETAILED DESCRIPTION

Hereinafter, example embodiments will be described in detail with reference to the accompanying drawings.

Figure 1:
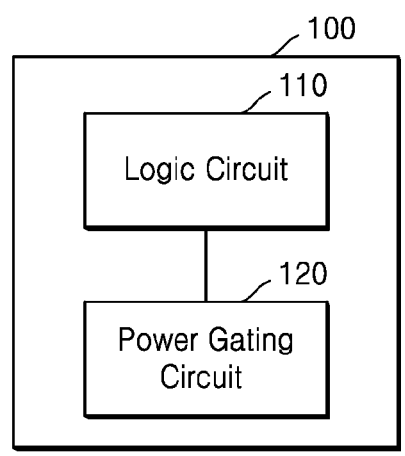
FIG. 1 is a block diagram of an integrated circuit, according to an example embodiment.

FIG. 1 is a block diagram of an integrated circuit 100, according to an example embodiment.

Referring to FIG. 1, the integrated circuit 100 according to an example embodiment may include a logic circuit 110 and a power gating circuit 120.

The integrated circuit 100 may include a plurality of standard cells. A standard cell is a unit of a layout included in an integrated circuit, may be designed to perform a predefined function, and may be referred to as a cell. The integrated circuit 100 may include a plurality of various standard cells, and the standard cells may be aligned and arranged in a plurality of rows.

The logic circuit 110 may be a circuit including transistors configured to perform a logical operation for performing an intended operation of the integrated circuit 100. Here, each of the transistors included in the logic circuit 110 may be referred to as a logic transistor. In addition, active regions and gate lines included in the logic circuit 110 may form the logic transistors, and the gate line in this structure may be referred to as a logic gate line.

The power gating circuit 120 may be a circuit including transistors for reducing the amount of leakage current. Here, each of the transistors included in the power gating circuit 120 may be referred to as a power gating transistor. In addition, active regions and a gate line included in the power gating circuit 120 may form a power gating transistor, and the gate line in this structure may be referred to as a power gate line.

In an example embodiment, the gate line may include a work function metal-containing layer and a gap-fill metal layer. For example, the work function metal-containing layer may include at least one of Ti, W, Ru, Nb, Mo, Hf, Ni, Co, Pt, Yb, Tb, Dy, Er, and Pd, and the gap-fill metal layer may be formed of a W layer or an Al layer. In an example embodiment, the gate lines may include a stack structure of TiAlC/TiN/W, a stack structure of TiN/TaN/TiAlC/TiN/W, or a stack structure of TiN/TaN/TiN/TiAlC/TiN/W.

The power gating circuit 120 may be configured to be turned on and become short-circuited when the logic circuit 110 is in an operation state. Accordingly, when the logic circuit 110 is operating, the power gating circuit 120 may allow a power supply voltage or a ground voltage to be applied to the logic circuit 110.

In addition, the power gating circuit 120 may be configured to be turned off when the logic circuit 110 is in a standby state, thereby blocking a current. Accordingly, when the logic circuit 110 is turned off, the power gating circuit 120 may prevent a leakage current from occurring.

To meet the need for miniaturized, multifunctional, and high-performance electronic products, a high-capacity integrated circuit may be required, and, furthermore, the operation speed of a transistor may be required to be improved. In addition, as the gate length of a transistor decreases, the operation speed of the transistor may be improved. However, when the gate length is shortened, the magnitude of a leakage current may increase due to a short-channel effect or the like. A standby current, which is a current flowing when a circuit is not operating, is determined in proportion to a leakage current, and as the magnitude of the standby current increases, the magnitude of the current flowing when the circuit is not operating increases, and thus, the power consumption of the circuit may also increase.

As the integrated circuit 100 includes the logic circuit 110 and the power gating circuit 120, the integrated circuit 100 may perform an intended operation, and, even when the integrated circuit 100 is implemented to have a small size, the amount of leakage current may be low. Accordingly, the integrated circuit 100 may operate with low power consumption.

In addition, as will be described later, the integrated circuit 100 may include the power gating circuit 120 having a small size, and thus, the integrated circuit 100 may be advantageous to be implemented as a circuit having a small size.

Figure 2A:
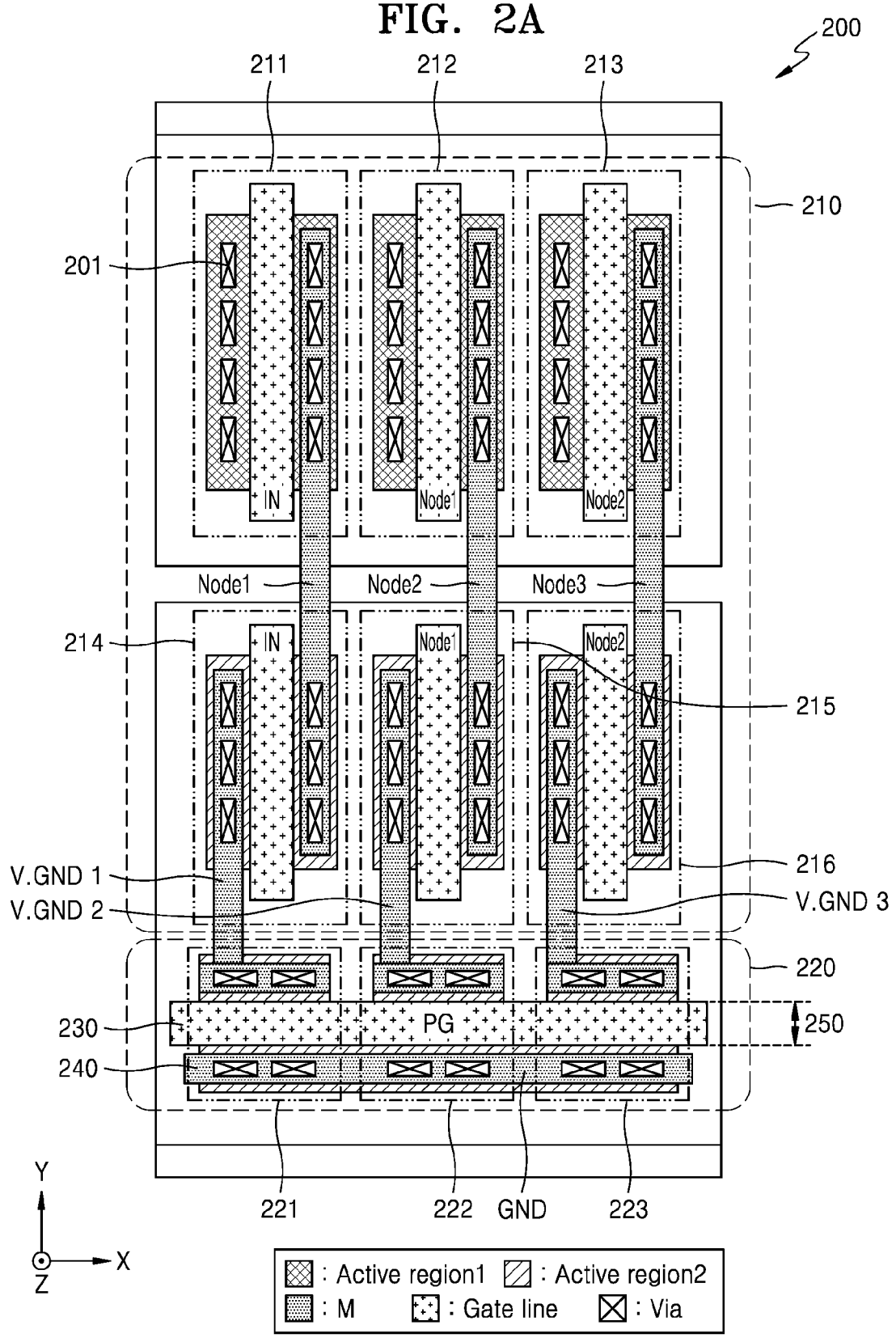
FIGS. 2A and 2B are diagrams of an integrated circuit, according to an example embodiment.
Figure 2B:
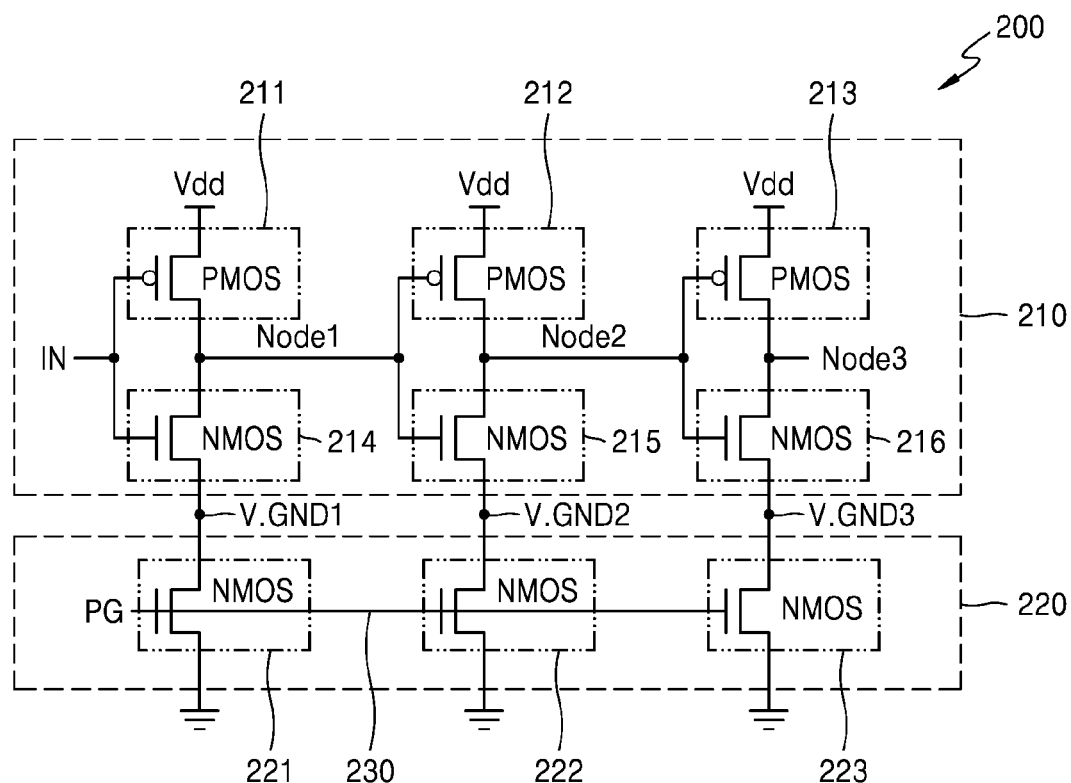

FIGS. 2A and 2B are diagrams of an integrated circuit 200, according to an example embodiment.

Referring to FIG. 2A, the integrated circuit 200 according to an example embodiment may include a plurality of logic gate lines extending in a first direction (e.g., a Y-axis direction). In addition, the integrated circuit 200 may include a logic circuit 210 including a plurality of logic transistors 211 to 216 (hereinafter, also referred to as the first to sixth logic transistors 211 to 216) including the plurality of logic gate lines.

The integrated circuit 200 may include a plurality of power gate lines. In addition, the integrated circuit 200 may include, among the plurality of power gate lines, a first power gate line 230 extending in a second direction (e.g., an X-axis direction) perpendicular to the first direction. Also, the integrated circuit 200 may include a plurality of power gating transistors 221 to 223 (hereinafter, also referred to as the first to third power gating transistors 221 to 223) including the first power gate line 230, and may include a power gating circuit 220 connected to the logic circuit 210.

In the integrated circuit 200 illustrated in FIG. 2A, the first logic transistor 211, the second logic transistor 212, and the third logic transistor 213 are P-type transistors, and the fourth logic transistor 214, the fifth logic transistor 215, the sixth logic transistor 216, the first power gating transistor 221, the second power gating transistor 222, and the third power gating transistor 223 are N-type transistors. However, the configuration of the integrated circuit 200 is not limited thereto, and a plurality of power gating transistors may be implemented as P-type transistors.

The above-described transistors may include active regions and gate lines of a standard cell, and may be implemented by a plurality of metal lines M and a plurality of vias 201. For example, P-type active regions Active region1 and the gate lines may constitute the first to third logic transistors 211 to 213. Also, N-type active regions Active region2 and the gate lines may constitute the fourth to sixth logic transistors 214 to 216 and the first to third power gating transistors 221 to 223. In addition, the transistors included in the integrated circuit 200 may be connected to each other through the patterns.

The power gating circuit 220 may include the first power gate line PG 230 extending in the second direction, which is different from the direction of the gate lines included in the logic circuit 210, and thus, the cell height may be reduced compared to in the case where a power gate line extending in the first direction is included. In detail, the cell height may indicate the length of a standard cell in the Y-axis direction. Accordingly, as the power gating circuit 220 includes a gate line extending in the X-axis direction, rather than a gate line extending in the Y-axis direction, the length of the standard cell in the Y-axis direction may be reduced. Therefore, the standard cell height may be relatively low, and the integrated circuit 200 may be implemented in a small size.

A plurality of sources included in the plurality of power gating transistors 221 to 223 may be connected to each other, and a plurality of drains included in the plurality of power gating transistors 221 to 223 may be connected to each other.

In addition, one of a power supply voltage and a ground voltage may be applied to each of the plurality of sources and each of the plurality of drains of the plurality of power gating transistors 221 to 223. In other words, the plurality of sources and the plurality of drains of the plurality of power gating transistors 221 to 223 may be connected to a power supply node or a ground node. For example, in the case where the power gating transistors are N-type transistors, the ground voltage may be applied to each of the plurality of drains of the plurality of power gating transistors. In addition, in the case where the power gating transistors are P-type transistors, the power supply voltage may be applied to each of the plurality of sources of the plurality of power gating transistors. As an example, for power-gating transistors 221 to 223 of N-type of FIG. 2B, the drains (also referred to as drain regions) are connected to ground. As another example, for power-gating transistors of P-type (consistent with FIG. 11), the sources (also referred to as source regions) are connected to the power supply, in an example embodiment.

A gate length 250 of the first power gate line 230 may be different from the gate length of logic gate lines constituting the plurality of logic transistors 211 to 216. The first power gate line 230 may be implemented to have a gate length differently depending on the required performance of the integrated circuit 200.

Referring to FIGS. 2A and 2B, the integrated circuit 200 may include the first logic transistor 211 connected between a power supply node Vdd to which the power supply voltage is applied and a first node Node1, the second logic transistor 212 connected between the power supply node Vdd and a second node Node2, the third logic transistor 213 connected between the power supply node Vdd and a third node Node3, the fourth logic transistor 214 connected between the first node Node1 and a first virtual ground node V.GND1, the fifth logic transistor 215 connected between the second node Node2 and a second virtual ground node V.GND2, the sixth logic transistor 216 connected between the third node Node3 and a third virtual ground node V.GND3, the first power gating transistor 221 connected between the first virtual ground node V.GND1 and a ground node GND to which the ground voltage is applied, the second power gating transistor 222 connected between the second virtual ground node V.GND2 and the ground node GND, and the third power gating transistor 223 connected between the third virtual ground node V.GND3 and the ground node GND. This is an example embodiment assuming that the power gating circuit 220 is a footer. The power gating circuit 220 may be implemented as a header, and the power gating transistors may be implemented as P-channel metal-oxide-semiconductor (PMOS) transistors. For example, in the case where the power gating circuit is implemented as a header, the integrated circuit 200 may include a first power gating transistor connected between a power supply node to which a power supply voltage is applied and a first virtual power supply node, a second power gating transistor connected between the power supply node and a second virtual power supply node, a third power gating transistor connected between the power supply node and a third virtual power supply node, a first logic transistor connected between the first virtual power supply node and a first node, a second logic transistor connected between the second virtual power supply node and a second node, a third logic transistor connected between the third virtual power supply node and a third node, a fourth logic transistor connected between the first node and a ground node to which a ground voltage is applied, a fifth logic transistor connected between the second node and the ground node, and a sixth logic transistor connected between the third node and the ground node. In this case, the first to third power gating transistors and the first to third logic transistors may be implemented as PMOS transistors, and the fourth to sixth logic transistors may be implemented as N-channel metal-oxide-semiconductor (NMOS) transistors, but the inventive concept is not limited thereto. In addition, the plurality of logic transistors may include logic gate lines extending in a first direction, and at least one of the plurality of power gating transistors may include a first power gate line extending in a second direction perpendicular to the first direction.

The first power gating transistor 221, the second power gating transistor 222, and the third power gating transistor 223 may share the first power gate line 230. In addition, when a gate voltage is applied to operate the plurality of power gating transistors 221 to 223, the gate voltage may be applied to a portion of the first power gate line 230. For example, the gate voltage may be applied to a portion of the first power gate line 230 corresponding to the first power gating transistor 221, rather than to the entire first power gate line 230. When a voltage is applied to a portion of the first power gate line, the portion of the first power gate line to which the voltage is applied may be widened as time passes. Accordingly, the gate voltage may be applied to a portion of the first power gate line 230 corresponding to the second power gating transistor 222, and thus the second power gating transistor 222 may be turned on. In other words, the plurality of power gating transistors 221 to 223 may be sequentially turned on in response to the gate voltage being applied to respective portions of the first power gate line 230. In this case, the current of the circuit may sequentially reach a peak current, and the circuit may stably operate as compared to the case where the gate voltage is applied to the entire gate line.

Figure 3A:
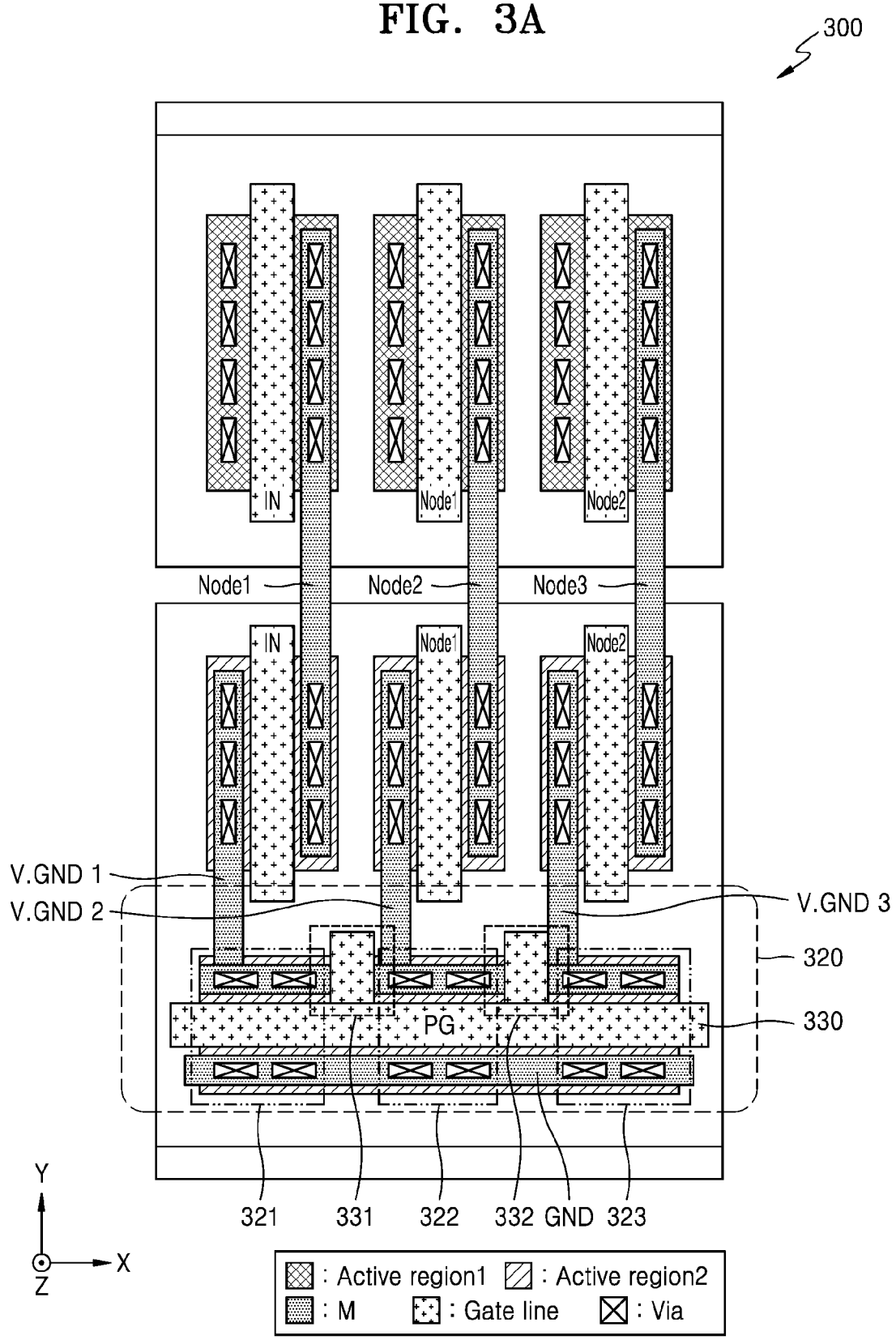
FIGS. 3A and 3B are diagrams of an integrated circuit, according to an example embodiment.
Figure 3B:
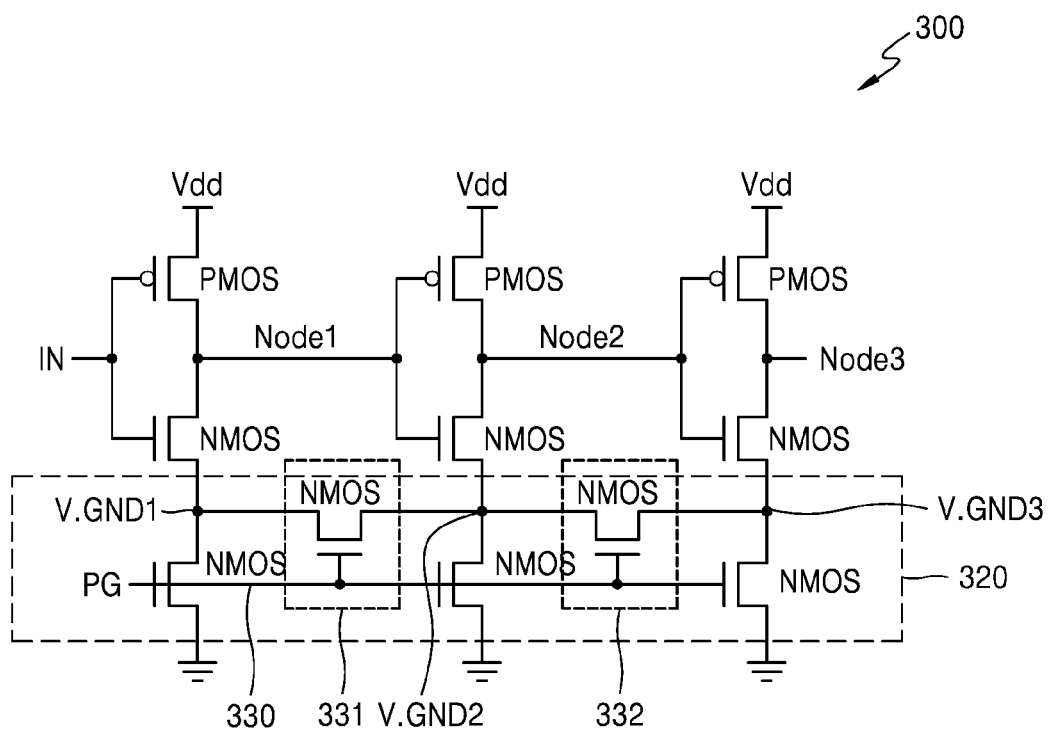

FIGS. 3A and 3B are diagrams of an integrated circuit 300, according to an example embodiment of the inventive concept.

Referring to FIGS. 3A and 3B, the integrated circuit 300 according to an example embodiment may include a power gating circuit 320. In addition, the power gating circuit 320 may include first to third power gating transistors 321 to 323 and one or more isolation transistors 331 and 332.

The isolation transistors 331 and 332 may be connected to the power gating transistors and a first power gate line 330. For example, the isolation transistor 331 may be connected between a first virtual ground node V.GND1 and a second virtual ground node V.GND2, and may be connected to the first power gate line 330. In addition, the isolation transistor 332 may be connected between the second virtual ground node V.GND2 and a third virtual ground node V.GND3, and may be connected to the first power gate line 330. Also, the isolation transistor 331 may be connected to the power gate line 330, and may be connected between the first power gating transistor 321 and the second power gating transistor 322. In addition, the isolation transistor 332 may be connected to the power gate line 330, and may be connected between the second power gating transistor 322 and the third power gating transistor 323.

The isolation transistors 331 and 332 may cause the power gating transistors 321 to 323 to be sequentially turned on. In detail, the isolation transistors 331 and 332 may be turned on to cause the power gating transistors 321 to 323 connected to the isolation transistors 331 and 332 to operate with the same node. In addition, the isolation transistors 331 and 332 may be turned off to separate sources or drains of the power gating transistors 321 to 323. When a gate voltage is applied to a portion of the power gate line corresponding to the gate of the isolation transistor, the isolation transistor may be turned on to cause the power gating transistors to be sequentially turned on.

Accordingly, it is possible to prevent a high voltage from being applied to the gate line at one time, and the integrated circuit may stably operate.

Figure 4A:
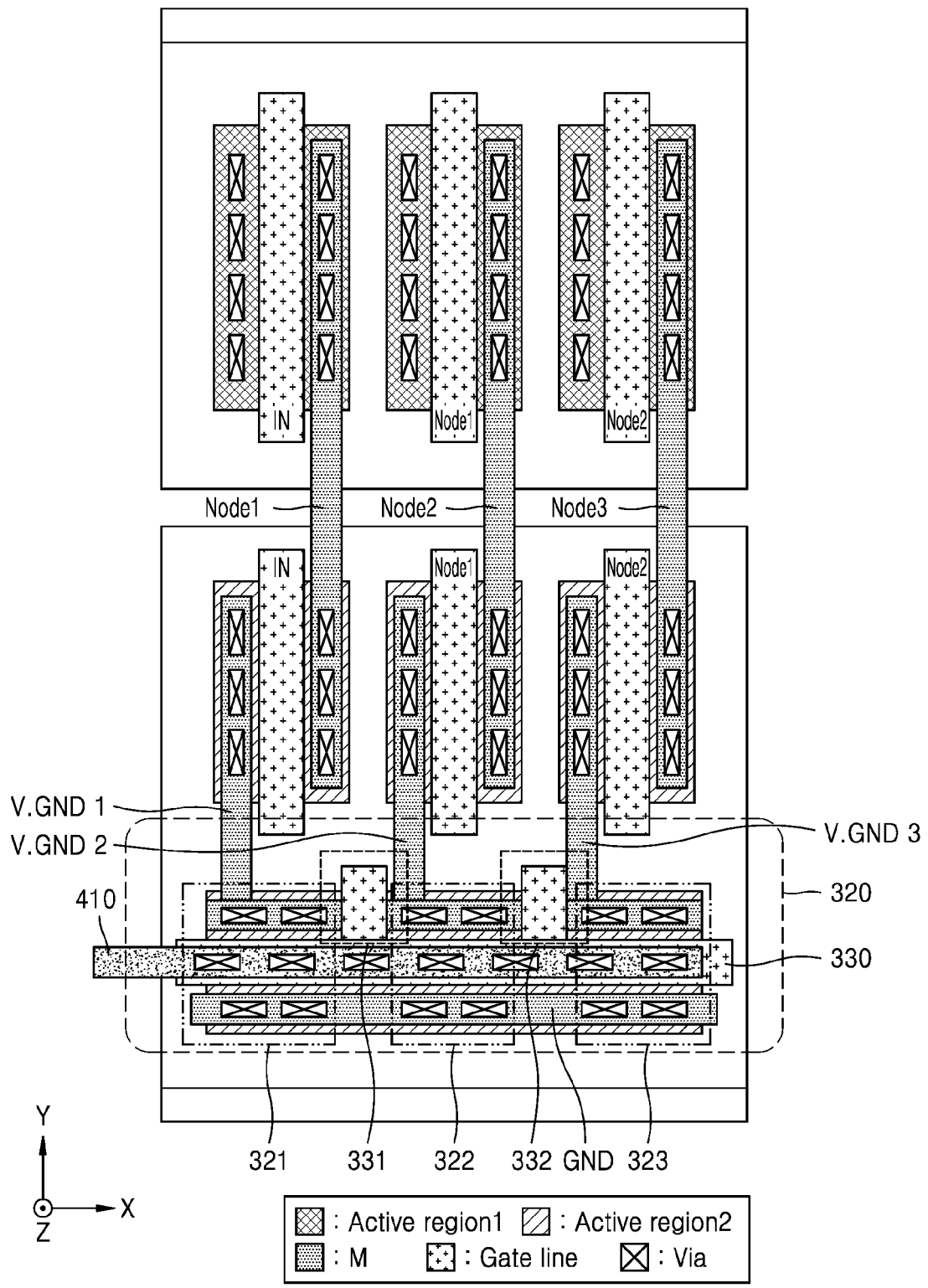
FIGS. 4A and 4B are diagrams of integrated circuits, according to example embodiments.
Figure 4B:
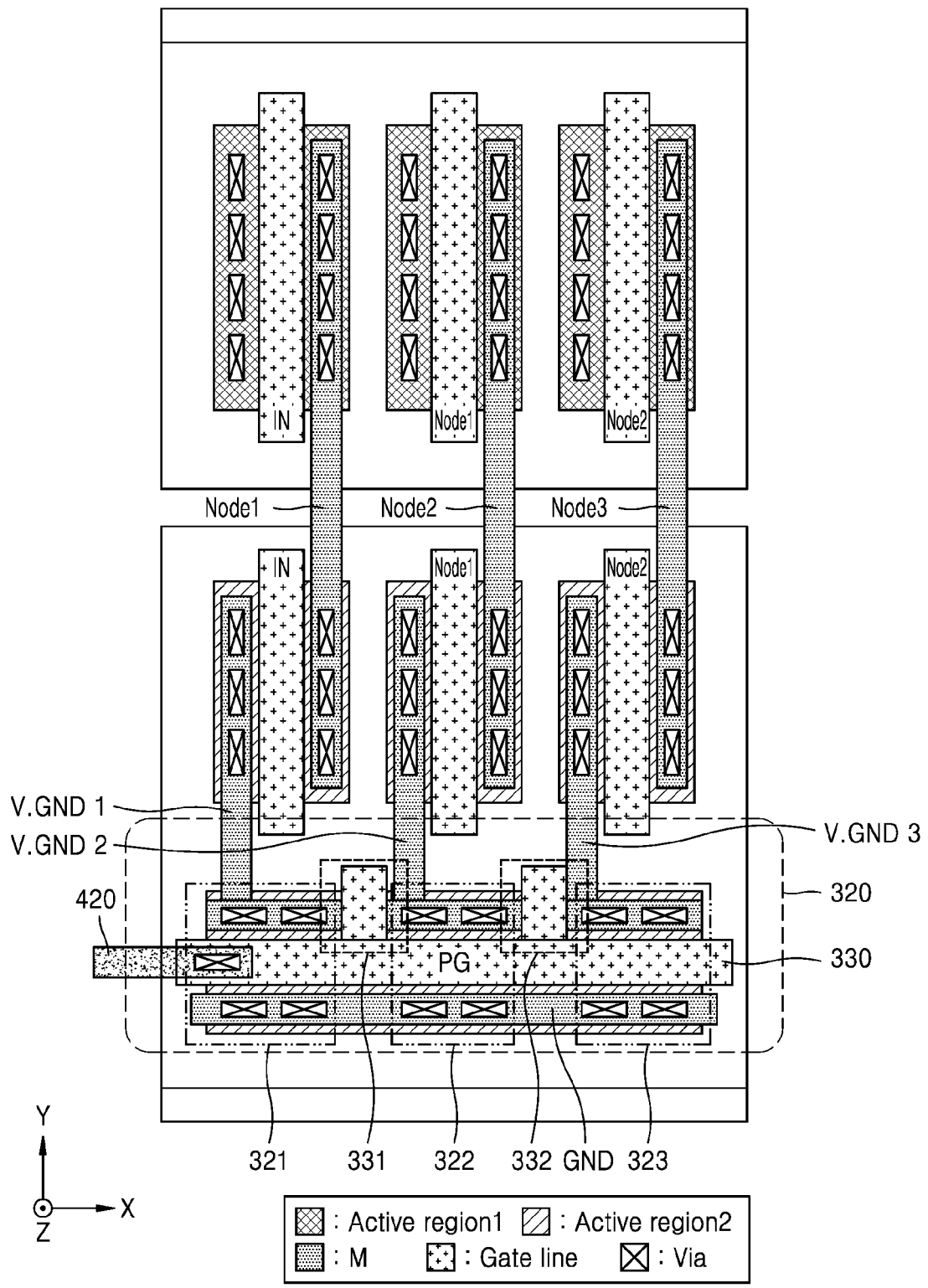

FIGS. 4A and 4B are diagrams of integrated circuits 300a and 300b, according to example embodiments.

Referring to FIGS. 4A and 4B, the integrated circuits 300a and 300b according to an example embodiment may include power gate signal lines 410 and 420, respectively. The power gate signal lines 410 and 420 may be patterns configured to transmit a signal to the power gate line 330. In addition, the power gate signal lines 410 and 420 may be configured to apply a gate voltage to the power gate line 330. Also, the power gate signal lines 410 and 420 may be connected to a logic circuit, and may be configured to transmit a power gating enable signal to the power gating circuit based on an operation state of the logic circuit.

In detail, the power gate signal lines 410 and 420 may transmit the power gating enable signal to the power gate line 330. In addition, a gate voltage may be applied to the power gate line 330 based on the power gating enable signal. For example, assuming that the first power gating transistor 321 is an NMOS transistor, when the logic circuit is in an active state, a power gating enable signal of a logic high level may be transmitted to the power gating circuit 320 by the power gate signal lines 410 and 420. When the power gating enable signal of a logic high level is transmitted to the power gate line 330 by the power gate signal lines 410 and 420, the gate voltage may be applied to the power gate line 330, and thus the first power gating transistor 321 may be turned on. When the first power gating transistor 321 is turned on, the first virtual ground node V.GND1 may be connected to the ground node GND.

In addition, assuming that the first power gating transistor 321 is an NMOS transistor, when the logic circuit is in an inactive state, a power gating enable signal of a logic low level may be transmitted to the power gating circuit 320 by the power gate signal lines 410 and 420. When the power gating enable signal of a logic low level is transmitted to the power gate line 330 by the power gate signal lines 410 and 420, the first power gating transistor 321 may be turned off.

Assuming that the power gating transistor is an PMOS transistor, when the logic circuit is in an active state, a power gating enable signal of a logic low level may be transmitted to the power gating circuit by the power gate signal line. When the power gating enable signal of a logic low level is transmitted to the power gate line by the power gate signal line, the power gating transistor may be turned on. When the power gating transistor is turned on, a virtual power supply node may be connected to the power supply node. Accordingly, a power supply voltage may be applied to the logic circuit.

In addition, assuming that the power gating transistor is a PMOS transistor, when the logic circuit is in an inactive state, a power gating enable signal of a logic high level may be transmitted to the power gating circuit by the power gate signal line. When the power gating enable signal of a logic high level is transmitted to the power gate line by the power gate signal line, the power gating transistor may be turned off.

Referring to FIG. 4A, the integrated circuit 300a may include the power gate signal line 410, and the power gate signal line 410 may be aligned with the power gate line 330. In detail, the power gate signal line 410 may be aligned with the power gate line 330 in a direction in which metal layers are stacked, and may be connected to the power gate line 330 through vias. In other words, the power gate signal line 410 may be aligned with the power gate line 330 in a third direction (e.g., a Z-axis direction) perpendicular to the first direction (e.g., the X-axis direction) and the second direction (e.g., the Y-axis direction). In this case, for example, a gate voltage may be entirely applied to the plurality of power gating transistors 321, 322, and 323, and thus the plurality of power gating transistors 321, 322, and 323 may be turned on.

Referring to FIG. 4B, the integrated circuit 300b may include the power gate signal line 420, and the power gate signal line 420 may be aligned with a portion of the power gate line 330. In detail, the power gate signal line 420 may be aligned with the portion of the power gate line 330 in a direction in which metal layers are stacked, and may be connected to the portion of the power gate line 330 through a via. In other words, the power gate signal line 420 may be aligned with the portion of the power gate line 330 in the third direction (e.g., the Z-axis direction) perpendicular to the first direction (e.g., the X-axis direction) and the second direction (e.g., the Y-axis direction). In this case, for example, a gate voltage may be sequentially applied from the first power gating transistor 321 to the third power gating transistor 323, and thus, the first to third power gating transistors 321 to 323 may be sequentially turned on.

Figure 5A:
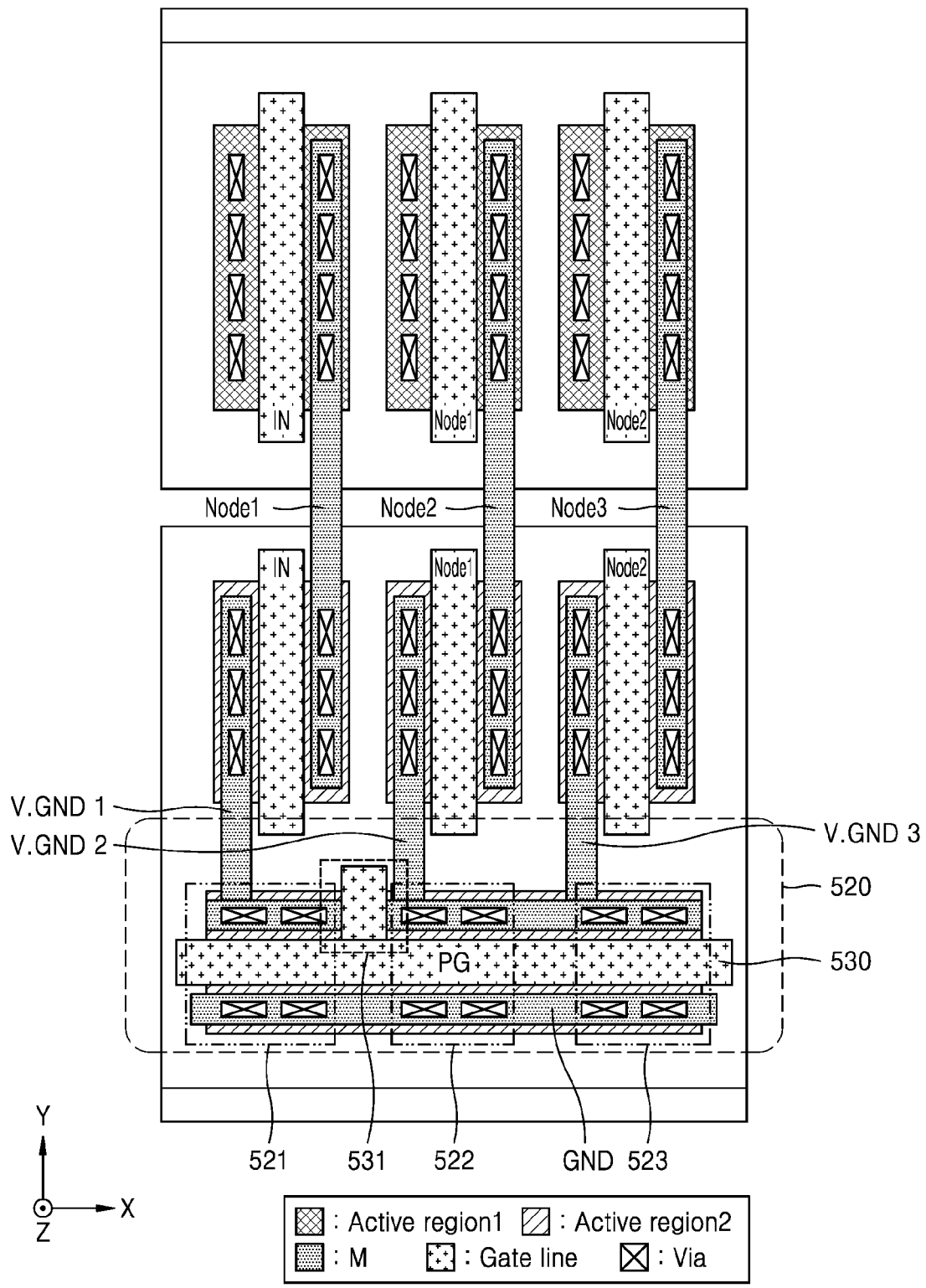
FIGS. 5A and 5B are diagrams of an integrated circuit, according to an example embodiment.
Figure 5B:
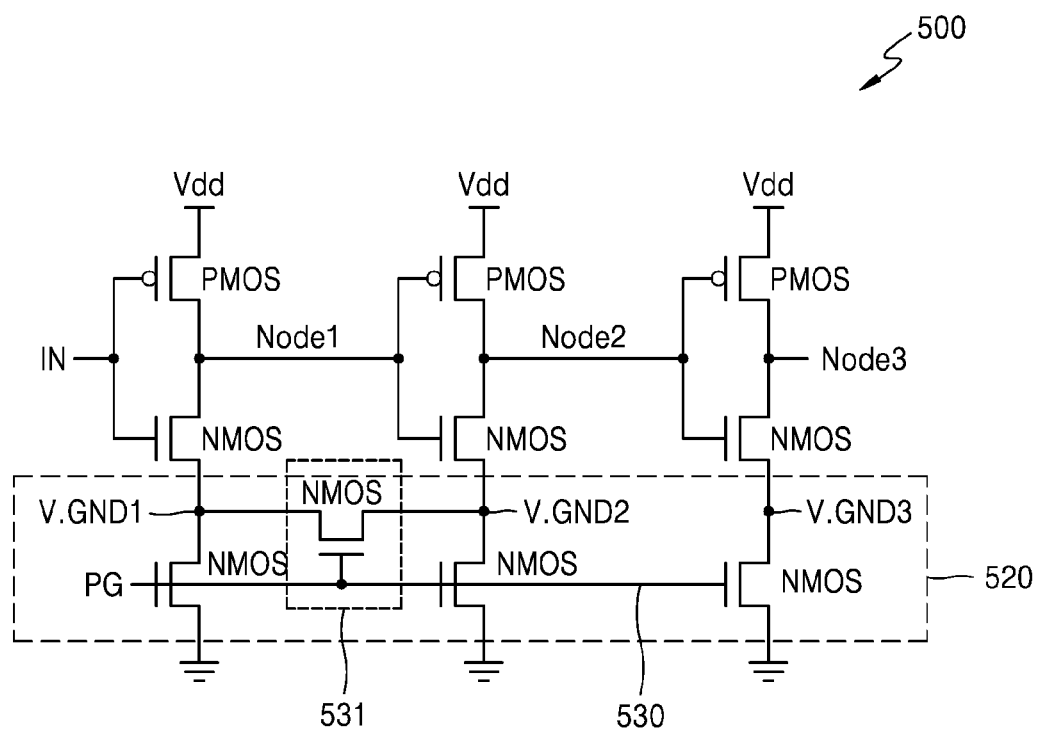

FIGS. 5A and 5B are diagrams of an integrated circuit 500, according to an example embodiment.

Referring to FIGS. 5A and 5B, the integrated circuit 500 according to an example embodiment may include a power gating circuit 520. In addition, the power gating circuit 520 may include first to third power gating transistors 521 to 523 and an isolation transistor 531.

The isolation transistor 531 may be connected to some of the power gating transistors. In detail, the isolation transistor 531 may be connected to a power gate line 530, and may be connected between the first power gating transistor 521 and the second power gating transistor 522. In addition, the sources and drains of the second power gating transistor 522 and the third power gating transistor 523 may be connected to each other, respectively.

The integrated circuit 500 may include the isolation transistor 531 to sequentially apply a voltage to the power gate line 530. Accordingly, it is possible to prevent a high voltage from being applied to the gate line at one time, and the integrated circuit may stably operate.

Figure 6A:
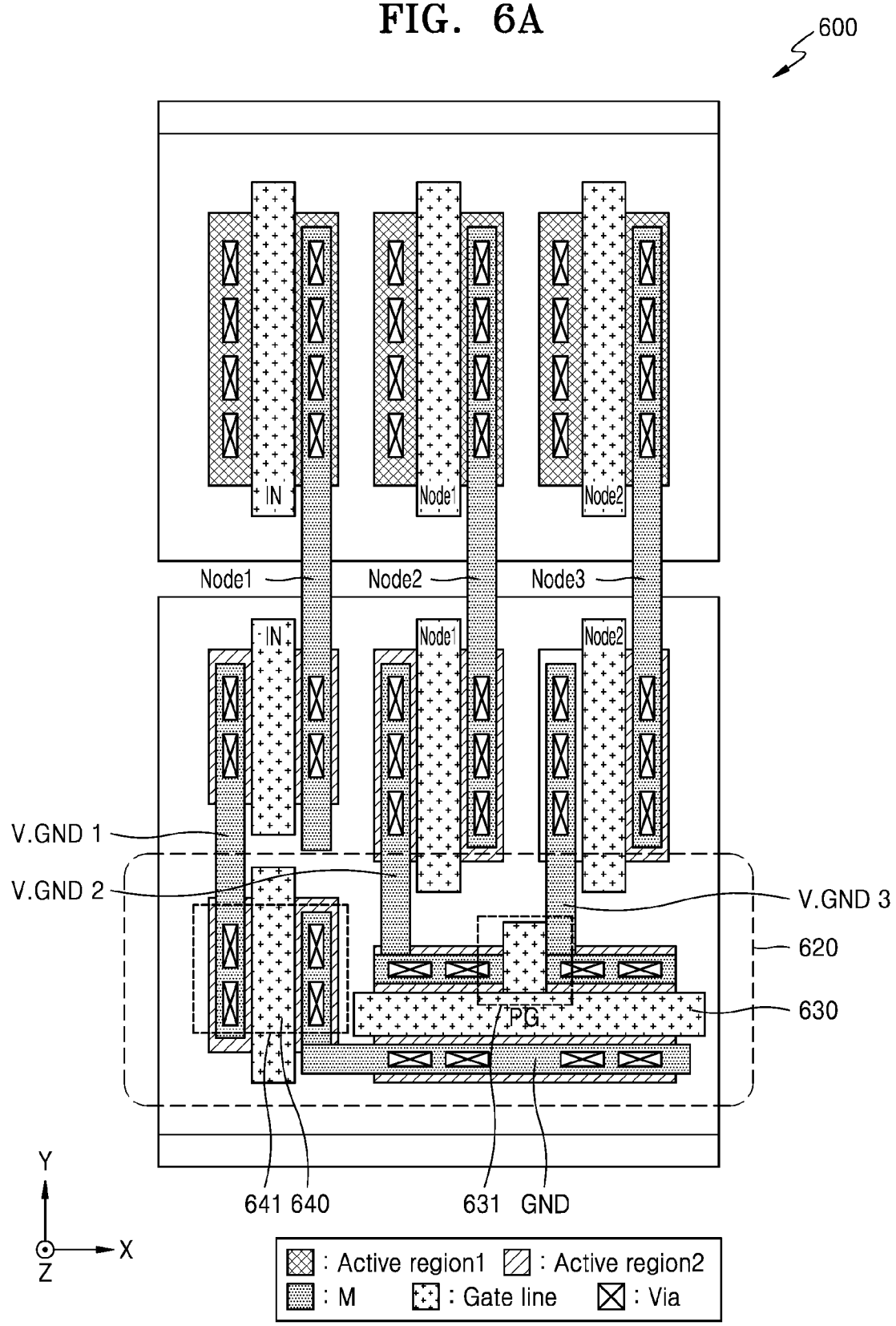
FIGS. 6A and 6B are diagrams of an integrated circuit, according to an example embodiment.
Figure 6B:
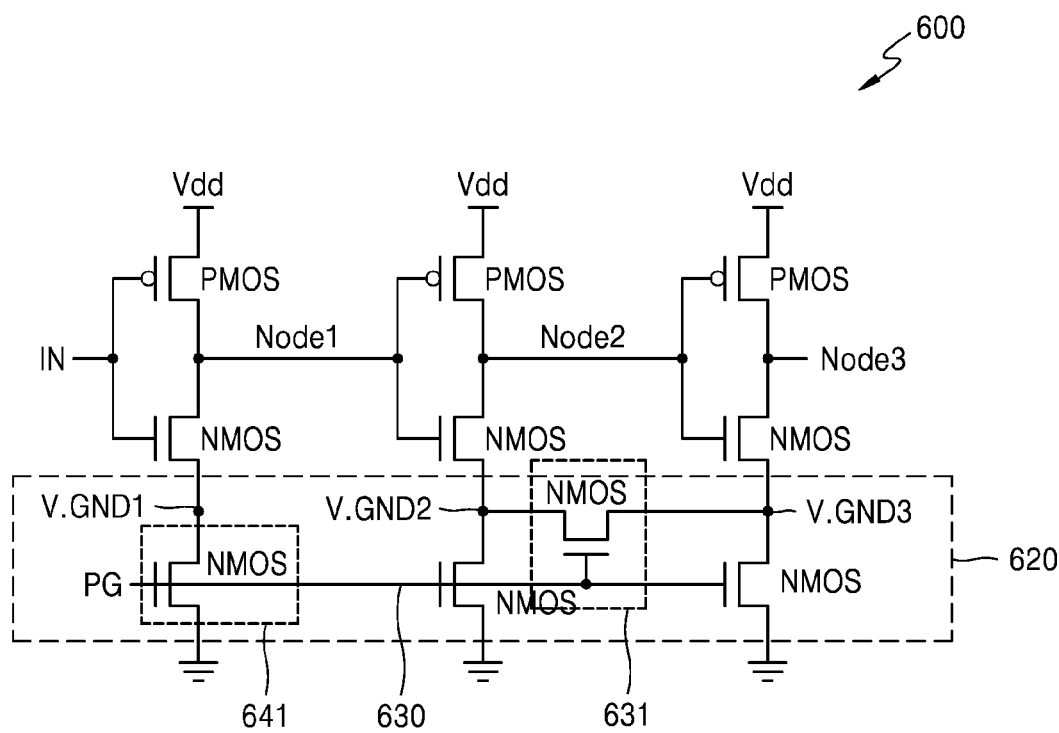

FIGS. 6A and 6B are diagrams of an integrated circuit 600, according to an example embodiment.

Referring to FIGS. 6A and 6B, the integrated circuit 600 according to an example embodiment may include a power gating circuit 620. In addition, the power gating circuit 620 may include a first power gating transistor 641 including a second power gate line 640 extending in the first direction (e.g., the Y-axis direction).

In other words, the power gating circuit 620 may include not only a first power gate line 630 extending in the second direction (the X-axis direction) but also the second power gate line 641 extending in the first direction if necessary.

In addition, although FIGS. 6A and 6B illustrate that the power gating circuit 620 includes an isolation transistor 631, an insulator may be formed between sources or drains of the power gating circuits. Alternatively, the sources and drains of the power gating circuits may be connected to each other, if necessary.

Figure 7:
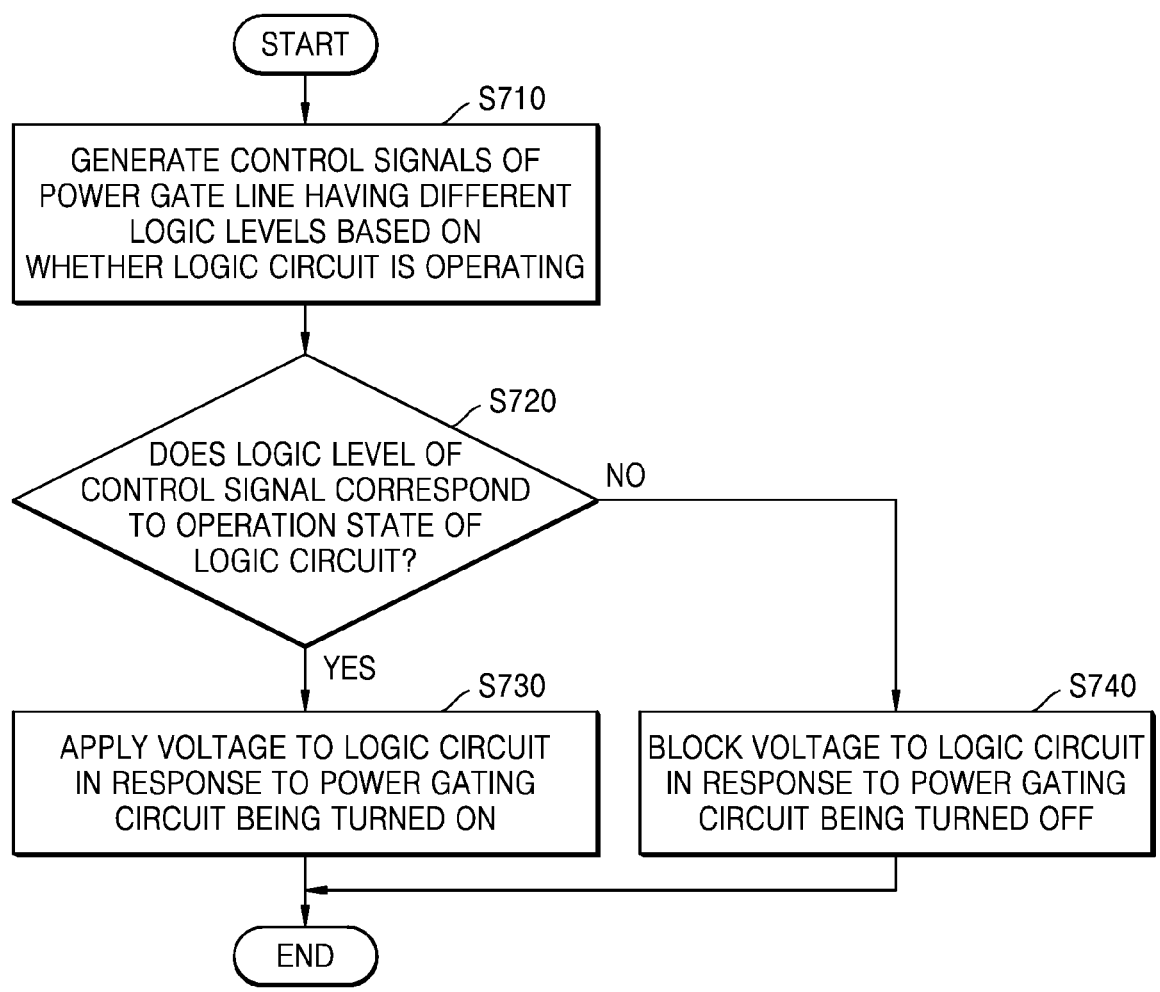
FIG. 7 is a flowchart of an operating method of an integrated circuit, according to an example embodiment.

FIG. 7 is a flowchart of an operating method of an integrated circuit, according to an example embodiment.

In operation S710, control signals of a power gate line having different logic levels may be generated based on whether a logic circuit is operating. For example, when the logic circuit is in an operation state, a control signal of the power gate line having a high level may be generated. In addition, when the logic circuit is in a standby state, a control signal of the power gate line having a low level may be generated. However, the level of the control signal is not limited to thereto.

In operation S720, it may be determined whether the logic level of the control signal is the logic level corresponding to an operation state of the logic circuit.

In operation S730, when the logic level of the control signal is the logic level corresponding to the operation state of the logic circuit (S720—YES), a power gating circuit may be turned on to allow a voltage to be applied to the logic circuit. In this case, the voltage may be a power supply voltage or a ground voltage.

In operation S740, when the logic level of the control signal is not the logic level corresponding to the operation state of the logic circuit (S720—NO), the power gating circuit may be turned off to block the voltage to the logic circuit.

Figure 8:
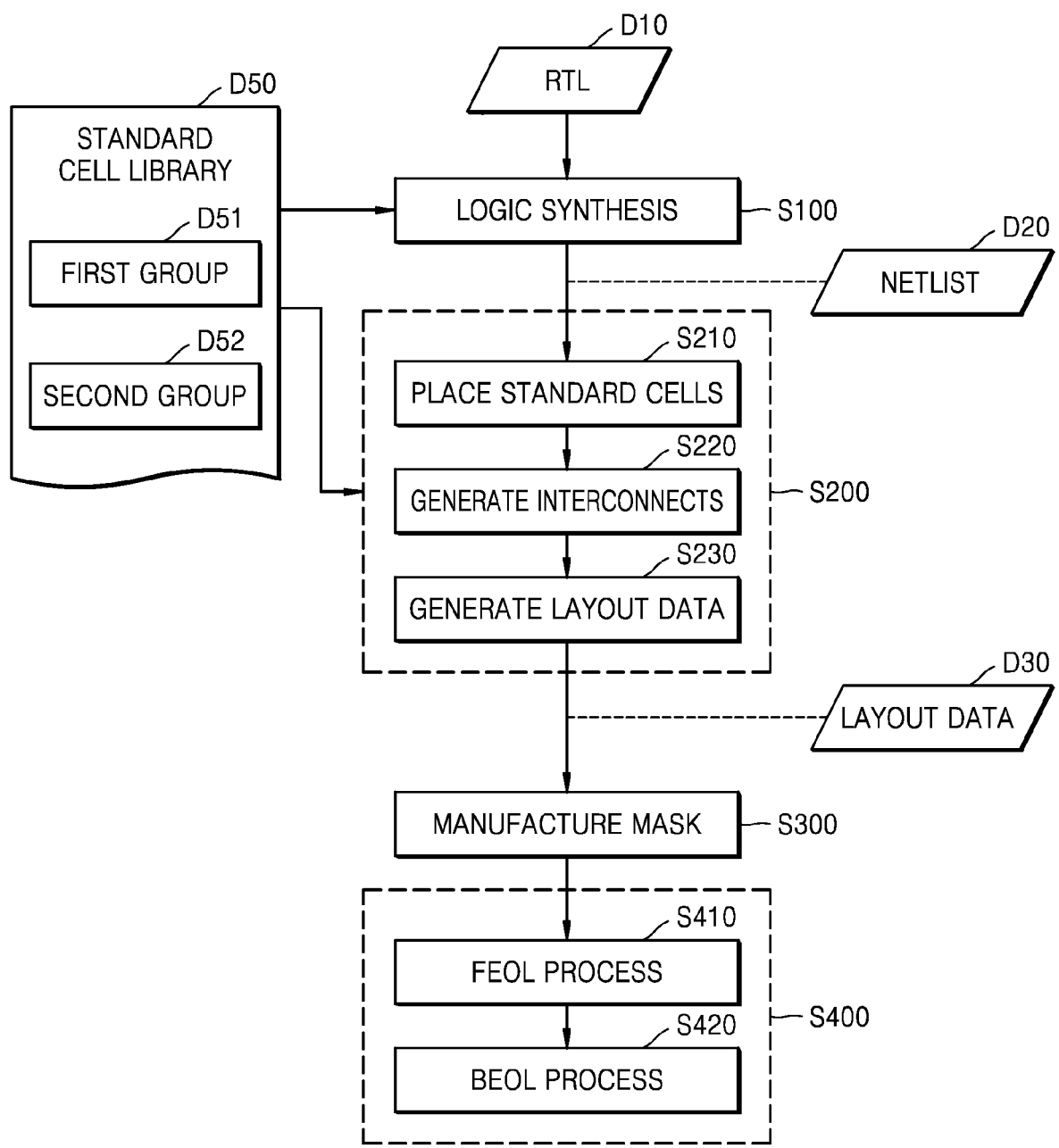
FIG. 8 is a flowchart of a method of fabricating an integrated circuit, according to an example embodiment.

FIG. 8 is a flowchart of a method of fabricating an integrated circuit, according to an example embodiment.

A standard cell library D50 may include information about a plurality of standard cells, for example, function information, characteristic information, layout information, and the like, and may include first group information D51 and second group information D52. The first group information D51 may include information about standard cells arranged in a normal cell, and the second group information D52 may include information about cells arranged in a power gating cell.

Referring to FIG. 8, in operation S100, a logic synthesis operation may be performed to generate netlist data D20 from register transfer level (RTL) data D10. For example, a semiconductor design tool (e.g., a logic synthesis tool) may generate the netlist data D20 including a bitstream or a netlist by performing logic synthesis with reference to the standard cell library D50, from the RTL data D10 written in a hardware description language (HDL) such as Very High Speed Integrated Circuit (VHSIC) Hardware Description Language (VHDL) and Verilog.

In operation S200, a place and routing (P&R) operation may be performed to generate layout data D30 from the netlist data D20. As illustrated in FIG. 8, the place and routing operation S200 may include a plurality of operations S210, S220, and S230.

In operation S210, an operation of placing standard cells may be performed. For example, a semiconductor design tool (e.g., a P&R tool) may place a plurality of standard cells from the netlist data D20 with reference to the standard cell library D50. The semiconductor design tool may place the standard cells on a grid including lines that intersect with each other with a preset length. First, power gating cells may be distributed and placed at regular intervals, and then the standard cells included in the normal cell may be placed.

In operation S220, an operation of generating interconnects may be performed. The interconnect may electrically connect an output pin and an input pin of the standard cell to each other, and may include, for example, at least one via and at least one conductive pattern. The generation of the interconnects may cause the standard cells to be routed to the power gating cells.

In operation S230, an operation of generating the layout data D30 may be performed. The layout data D30 may have a format such as GDSII, and may include geometric information of the standard cells and the interconnects.

In operation S300, an operation of manufacturing a mask may be performed. For example, patterns formed in a plurality of layers may be defined according to the layout data D30, and at least one mask (or photomask) for forming respective patterns of the plurality of layers may be manufactured.

In operation S400, an operation of fabricating an integrated circuit may be performed. For example, the integrated circuit may be fabricated by patterning the plurality of layers by using the at least one mask manufactured in operation S300. As illustrated in FIG. 8, operation S400 may include operations S410 and S420, but is not limited thereto.

In operation S410, a front-end-of-line (FEOL) process may be performed. The FEOL process may refer to a process of forming individual devices, for example, a transistor, a capacitor, a resistor, and the like, on a substrate during fabrication of an integrated circuit. For example, the FEOL process may include planarizing and cleaning a wafer, forming a trench, forming a well, forming a gate line, forming a source and a drain, and the like.

In operation S420, a back-end-of-line (BEOL) process may be performed. The BEOL process may refer to a process of interconnecting individual devices, for example, a transistor, a capacitor, a resistor, and the like, during fabrication of an integrated circuit. For example, the BEOL process may include silicidating a gate line, a source region, and a drain region, adding a dielectric, planarizing, forming a hole, adding a metal layer, forming a via, forming a passivation layer, and the like, but is not limited thereto. Thereafter, the integrated circuit may be packaged into a semiconductor package, and may be used as a component of various applications.

Figure 9:
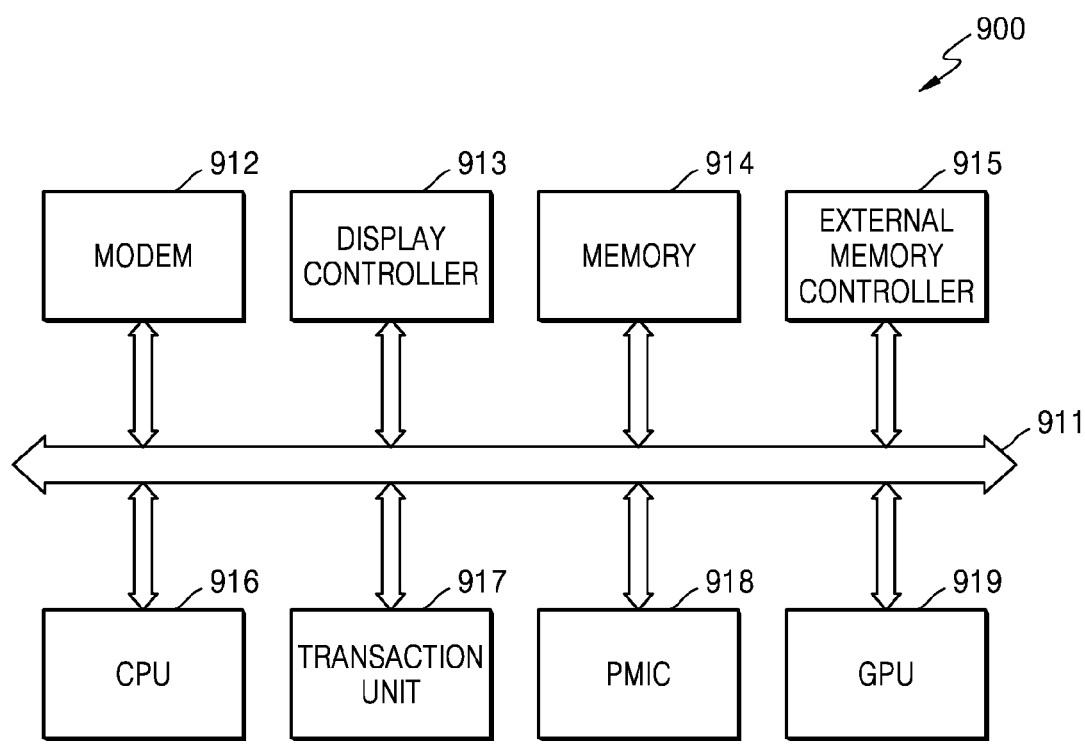
FIG. 9 is a block diagram of a system-on-chip (SoC), according to an example embodiment.

FIG. 9 is a block diagram of a system-on-chip (SoC) 900, according to an example embodiment.

The SoC 900 is a semiconductor device, and may include an integrated circuit according to an example embodiment. The SoC 900 is implemented by integrating complex functional blocks, such as intellectual properties (IPs) performing various functions, into a single chip, and a standard cell and a power line according to an example embodiment may be included in each functional block of the SoC 900, and accordingly, the SoC 900 may have an improved degree of integration and an improved degree of freedom in routing.

Referring to FIG. 9, the SoC 900 may include a modem 912, a display controller 913, a memory 914, an external memory controller 915, a central processing unit (CPU) 916, a transaction unit 917, a power management integrated circuit (PMIC) 918, and a graphics processing unit (GPU) 919, and the functional blocks of the SoC 900 may communicate with each other through a system bus 911.

The CPU 916, which may control the overall operation of the SoC 900, may control operations of the other functional blocks, i.e., the modem 912, the display controller 913, the memory 914, the external memory controller 915, the transaction unit 917, the PMIC 918, and the GPU 919. The modem 912 may demodulate a signal received from the outside of the SoC 900, or may modulate a signal generated in the SoC 900 and transmit the modulated signal to the outside. The external memory controller 915 may control operations of transmitting and receiving data to and from an external memory device connected to the SoC 900. For example, programs and/or data stored in the external memory device may be provided to the CPU 916 or the GPU 919 under the control by the external memory controller 915. The GPU 919 may execute program instructions related to graphics processing. The GPU 919 may receive graphic data through the external memory controller 915, and may transmit graphic data processed by the GPU 919 to the outside of the SoC 900 through the external memory controller 915. The transaction unit 917 may monitor a data transaction of each functional block, and the PMIC 918 may control power supplied to each functional block under the control by the transaction unit 917. The display controller 913 may control a display (or a display device) outside the SoC 900 to transmit data generated in the SoC 900 to the display.

The memory 914 may include a non-volatile memory, such as electrically erasable programmable read-only memory (EEPROM), flash memory, phase-change randomaccess memory (PRAM), resistive RAM (RRAM), nano-floating gate memory (NFGM), polymer RAM (PoRAM), magnetic RAM (MRAM), or ferroelectric RAM (FRAM), or may include a volatile memory, such as dynamic RAM (DRAM), static RAM (SRAM), mobile DRAM, double data rate (DDR) synchronous DRAM (SDRAM), low-power DDR (LPDDR) SDRAM, graphics DDR (GDDR) SDRAM, or Rambus DRAM (RDRAM).

Figure 10:
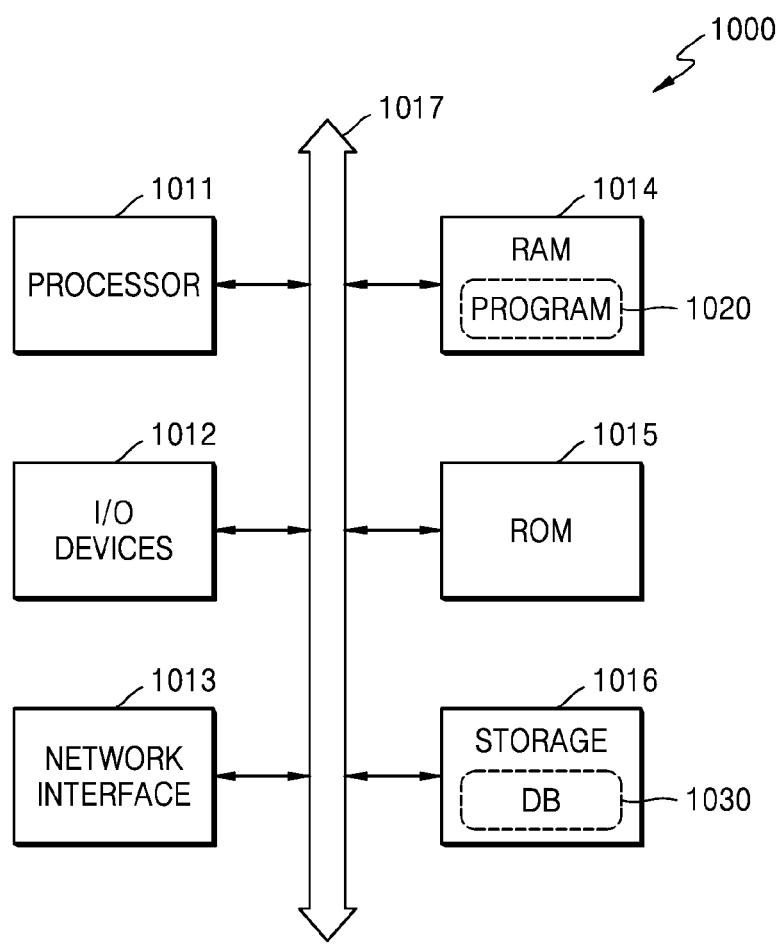
FIG. 10 is a block diagram of a computing system including a memory storing a program, according to an example embodiment.

FIG. 10 is a block diagram of a computing system 1000 including a memory storing a program, according to an example embodiment.

At least some of operations included in a method of fabricating an integrated circuit (e.g., the method of fabricating an integrated circuit described above with reference to FIG. 2A) according to an example embodiment may be performed by the computing system 1000.

The computing system 1000 may be a stationary computing system such as a desktop computer, a workstation, a server, or the like, or may be a portable computing system such as a laptop computer, or the like. As illustrated in FIG. 10, the computing system 1000 may include a processor 1011, input/output devices 1012, a network interface 1013, a RAM 1014, a ROM 1015, and a storage device 1016. The processor 1011, the input/output devices 1012, the network interface 1013, the RAM 1014, the ROM 1015, and the storage device 1016 may be connected to a bus 1017, and may communicate with each other through the bus 1017.

The processor 1011 may be referred to as a processing unit, and may include at least one core capable of executing an arbitrary instruction set (e.g., Intel Architecture-32 (IA-32), 64-bit extension IA-32, x86-64, PowerPC, Sparc, MIPS, ARM, IA-64, etc.), for example, a micro-processor, an application processor (AP), a digital signal processor (DSP), a GPU, etc. For example, the processor 1011 may access a memory, that is, the RAM 1014 or the ROM 1015, through the bus 1017, and execute instructions stored in the RAM 1014 or the ROM 1015.

The RAM 1014 may store a program 1020 for fabricating an integrated circuit according to an example embodiment, or at least part of the program 1020, and the program 1020 may cause the processor 1011 to perform at least some of operations included in a method of fabricating an integrated circuit. That is, the program 1020 may include a plurality of instructions executable by the processor 1011, and the plurality of instructions included in the program 1020 may cause the processor 1011 to perform, for example, the logic synthesis operation of operation S100 and/or the place and routing (P&R) operation of operation S200 of FIG. 8.

The storage device 1016 may not lose data stored therein even when power supplied to the computing system 1000 is cut off. For example, the storage device 1016 may include a non-volatile memory device, or may include a storage medium such as a magnetic tape, an optical disk, or a magnetic disk. In addition, the storage device 1016 may be removable from the computing system 1000. The storage device 1016 may also store the program 1020 according to an example embodiment, and the program 1020 or at least part thereof may be loaded from the storage device 1016 to the RAM 1014 before the program 1020 is executed by the processor 1011. Alternatively, the storage device 1016 may store a file written in a programming language, and a program generated by a compiler or the like from the file or at least part of the program may be loaded to the RAM 1014. In addition, as illustrated in FIG. 10, the storage device 1016 may store a database 1030, and the database 1030 may include information required to design an integrated circuit.

The storage device 1016 may also store data to be processed by the processor 1011 or data processed by the processor 1011. That is, the processor 1011 may generate data by processing data stored in the storage device 1016 according to a program, and may also store the generated data in the storage device 1016. For example, the storage device 1016 may store the RTL data D10, the netlist data D20, and/or the layout data D30.

The input/output devices 1012 may include an input device such as a keyboard, a pointing device, or the like, and may include an output device such as a display device, a printer, or the like. For example, a user may trigger execution of a program by the processor 1011 through the input/output devices 1012, input the RTL data D10 and/or the netlist data D20 of FIG. 8, and check the layout data D30 of FIG. 8.

The network interface 1013 may provide access to a network outside the computing system 1000. For example, the network may include a plurality of computing systems and communication links, and the communication links may include wired links, optical links, wireless links, or any other types of links.

Figure 11:
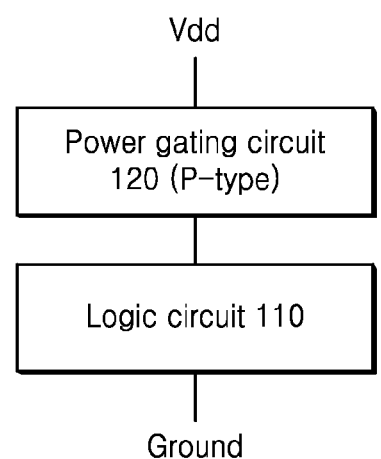
FIG. 11 is a schematic representation of a logic circuit and power gate circuit based on P-type transistors, according to an example embodiment.

FIG. 11 is an example schematic representation of a logic circuit and power gate circuit based on P-type transistors. In FIG. 11, the logic circuit 110 is connected to a ground node to which a ground voltage is applied, and the power gating circuit 120 is connected to the logic circuit and a power supply node to which a power supply voltage is applied. In this example, the power gating circuit 120 is based on P-type transistors.

While example embodiments have been particularly shown and described, it will be understood that various changes in form and details may be made therein without departing from the spirit and scope of the following claims.

What is claimed is:

1. A fabricated integrated circuit comprising:
  a logic circuit comprising a plurality of logic transistors, the logic circuit comprising a plurality of logic gate lines extending in a first direction; and
  a power gating circuit comprising a plurality of power gating transistors, the power gating circuit comprising a first power gate line extending in a second direction that is perpendicular to the first direction, and the power gating circuit being connected to the logic circuit,
  wherein a plurality of source regions respectively included in the plurality of power gating transistors are connected to each other to a power supply, the plurality of power gating transistors being connected to each other via the first power gate line extending in the second direction, or a plurality of drain regions respectively included in the plurality of power gating transistors are connected to each other to a ground, the plurality of power gating transistors being connected to each other via the first power gate line extending in the second direction,
  wherein the power gating circuit further comprises:
    a first power gating transistor of the plurality of power gating transistors, wherein a first conductor of a first gate of the first power gating transistor is the first power gate line;
    a second power gating transistor of the plurality of power gating transistors, wherein a second conductor of a second gate of the second power gating transistor is the first power gate line; and
    an isolation transistor connected to the first power gate line and connected between the first power gating transistor and the second power gating transistor, wherein a third conductor of a third gate of the isolation transistor is a first metal portion extending in the first direction from the first power gate line over a first active region, and the first active region provides a field effect channel for each of the first power gating transistor, the second power gating transistor, and the isolation transistor.

2. The fabricated integrated circuit of claim 1, further comprising a power gate signal line configured to apply a gate voltage to the first power gate line, wherein the power gate signal line is aligned with a portion of the first power gate line in a third direction that is perpendicular to the first direction and perpendicular to the second direction.

3. The fabricated integrated circuit of claim 1, wherein a ground voltage is applied to each of the plurality of drain regions or a power supply voltage is applied to each of the plurality of source regions.

4. The fabricated integrated circuit of claim 1, wherein a first gate length of the first power gate line is different from a second gate length of a logic gate line of the plurality of logic gate lines.

5. The fabricated integrated circuit of claim 1, wherein the power gating circuit further comprises:
a third power gating transistor; and
a second power gate line extending in the first direction.

6. The fabricated integrated circuit of claim 1, wherein the plurality of power gating transistors are configured to be sequentially turned on in response to a gate voltage being applied to a portion of the first power gate line.

7. The fabricated integrated circuit of claim 1, further comprising a signal line configured to apply a control voltage to the first power gate line,
wherein the signal line is configured as a metal,
wherein the first power gate line comprises a work function metal,
wherein the metal of the signal line is connected to the first power gate line at one end of the first power gate line.

8. A fabricated integrated circuit comprising:
a plurality of logic transistors comprising:
a first logic transistor connected between a power supply node and a first node, wherein the power supply node is configured to have a power supply voltage applied thereto;
a second logic transistor connected between the power supply node and a second node;
a third logic transistor connected between the power supply node and a third node;
a fourth logic transistor connected between the first node and a first virtual ground node;
a fifth logic transistor connected between the second node and a second virtual ground node; and
a sixth logic transistor connected between the third node and a third virtual ground node; and
a plurality of power gating transistors comprising:
a first power gating transistor connected between the first virtual ground node and a ground node wherein a ground voltage is applied to the ground node;
a second power gating transistor connected between the second virtual ground node and the ground node; and
a third power gating transistor connected between the third virtual ground node and the ground node; and
a logic gate line extending in a first direction,
wherein at least two of the plurality of power gating transistors are connected to a first power gate line extending in a second direction that is perpendicular to the first direction, wherein a first conductor of a first gate of the first power gating transistor is the first power gate line;

wherein a second conductor of a second gate of the second power gating transistor is the first power gate line; and wherein the fabricated integrated circuit further comprises an isolation transistor connected to the first power gate line and connected between the first power gating transistor and the second power gating transistor, wherein a third conductor of a third gate of the isolation transistor is a first metal portion extending in the first direction from the first power gate line over a first active region, and the first active region provides a field effect channel for each of the first power gating transistor, the second power gating transistor, and the isolation transistor.

9. The fabricated integrated circuit of claim 8, wherein the first power gate line is shared by the first power gating transistor, the second power gating transistor, and the third power gating transistor.

10. The fabricated integrated circuit of claim 8, wherein the fabricated integrated circuit comprises a second power gate line connected to the first power gating transistor and extending in the first direction, and the first power gate line is shared by the second power gating transistor and the third power gating transistor.

11. The fabricated integrated circuit of claim 8, wherein a plurality of source regions respectively included in the first power gating transistor, the second power gating transistor, and the third power gating transistor are connected to each other, and
the plurality of source regions of the plurality of power gating transistors are connected to the ground node.

12. The fabricated integrated circuit of claim 8, wherein a first gate length of the first power gate line is different from a second gate length of the logic gate line.

13. The fabricated integrated circuit of claim 8, wherein the plurality of power gating transistors are configured to be sequentially turned on in response to a gate voltage being applied to a portion of the first power gate line.

14. The fabricated integrated circuit of claim 8, wherein the first logic transistor, the second logic transistor, and the third logic transistor are P-type transistors, and
the fourth logic transistor, the fifth logic transistor, the sixth logic transistor, the first power gating transistor, the second power gating transistor, and the third power gating transistor are N-type transistors.

15. A fabricated integrated circuit comprising:
a logic circuit; and
a power gating circuit configured to:
be turned on and become short-circuited when the logic circuit is in an operation state, and
to be turned off when the logic circuit is in a standby state to block a current,
wherein the logic circuit includes a plurality of logic gate lines extending in a first direction, and
wherein the power gating circuit includes at least one power gate line extending in a second direction that is perpendicular to the first direction, and
wherein the power gating circuit comprises a plurality of power gating transistors sharing a power gate line extending in the second direction, wherein the power gating circuit further comprises:
- a first power gating transistor of the plurality of power gating transistors, wherein a first conductor of a first gate of the first power gating transistor is the power gate line;
- a second power gating transistor of the plurality of power gating transistors, wherein a second conductor of a second gate of the second power gating transistor is the power gate line; and
- an isolation transistor connected to the power gate line and connected between the first power gating transistor and the second power gating transistor,
- wherein a third conductor of a third gate of the isolation transistor is a first metal portion extending in the first direction from the power gate line over a first active region, and
- the first active region provides a field effect channel for each of the first power gating transistor, the second power gating transistor, and the isolation transistor.

16. The fabricated integrated circuit of claim 15, wherein when the power gating circuit is turned on, a gate voltage is applied to a portion of the power gate line such that a widening gate voltage is sequentially applied to each of the plurality of power gating transistors.

17. The fabricated integrated circuit of claim 16, wherein a first gate length of the power gate line is different from a second gate length of a logic gate line of the plurality of logic gate lines.

18. The fabricated integrated circuit of claim 15, wherein the logic circuit is connected to a ground node to which a ground voltage is applied, and
the power gating circuit is connected to the logic circuit and a power supply node to which a power supply voltage is applied.

19. The fabricated integrated circuit of claim 15, wherein the logic circuit is connected to a power supply node to which a power supply voltage is applied, and
the power gating circuit is connected to the logic circuit and a ground node to which a ground voltage is applied.

* * * * *